United States Patent
Horanzy

(10) Patent No.: US 9,684,018 B2
(45) Date of Patent: Jun. 20, 2017

(54) CURRENT SENSE CIRCUIT THAT OPERATES OVER A WIDE RANGE OF CURRENTS

(71) Applicant: Texas Instruments Incorporated, Dallas, TX (US)

(72) Inventor: Joseph Alexander Horanzy, Warrington, PA (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 303 days.

(21) Appl. No.: 14/548,110

(22) Filed: Nov. 19, 2014

(65) Prior Publication Data

US 2016/0139187 A1    May 19, 2016

(51) Int. Cl.
  *G01R 19/32*  (2006.01)
  *G01R 19/00*  (2006.01)
  *G01R 1/20*   (2006.01)

(52) U.S. Cl.
  CPC ......... *G01R 19/32* (2013.01); *G01R 19/0092* (2013.01); *G01R 1/203* (2013.01)

(58) Field of Classification Search
  CPC ........ G01R 1/44; G01R 11/185; G01R 19/32; G01R 21/14; G01R 31/26; G01R 31/2642; G01R 31/2648; G01R 31/2831; G01R 31/31702
  See application file for complete search history.

(56) References Cited

U.S. PATENT DOCUMENTS

| | | | |
|---|---|---|---|
| 2011/0181263 A1* | 7/2011 | Maruyama | H03K 17/0828 323/284 |
| 2012/0313709 A1* | 12/2012 | Lautzenhiser | H03F 1/301 330/285 |

\* cited by examiner

*Primary Examiner* — Tung X Nguyen
(74) *Attorney, Agent, or Firm* — John R. Pesetto; Charles A. Brill; Frank D. Cimino

(57) ABSTRACT

The magnitude of an output current that flows into a load is determined by placing a sense bipolar transistor and a sense resistor in series with the load, utilizing the non-linear current characteristics of the base-emitter junction of the sense bipolar transistor to compress and sense an emitter current logarithmically, and then performing an inverse log function to determine the emitter current, which is substantially identical to the output current that flows into the load.

18 Claims, 2 Drawing Sheets

CURRENT SENSE CIRCUIT THAT OPERATES OVER A WIDE RANGE OF CURRENTS

BACKGROUND OF THE INVENTION

1. Field of the Invention

The present invention relates to current sense circuits and, more particularly, to a current sense circuit that operates over a wide range of currents.

2. Description of the Related Art

A current sense circuit is a circuit that measures the magnitude of a current that flows into a load, such as a device under test (DUT). Current sense circuits are commonly implemented with a sense resistor that lies in series with the load, an operational amplifier that has a non-inverting input and an inverting input that are connected to the opposite ends of the sense resistor, and a processing circuit that is connected to the output of the operational amplifier.

In operation, the operational amplifier amplifies the voltage drop that lies across the sense resistor. Knowing the value of the sense resistor along with the voltage drop across the sense resistor, the processing circuit determines the magnitude of the current that flows through the sense resistor using the well-known equation V=IR or I=V/R.

Current sense circuits that incorporate this basic approach work fine when the range of potential currents is relatively small. However, when the range of potential currents is large, such as from less than 1 µA up to 100 mA, these types of current sense circuits often employ resistor switching circuitry to keep the operational amplifier from saturating when the larger currents are present.

The resistor switching circuitry typically includes a bank of sense resistors, switching circuitry that places one or more of the sense resistors from the bank of sense resistors into the current sense circuit, and control circuitry that determines when one sense resistor needs to be replaced with a different sense resistor.

One drawback to using resistor switching circuitry is that there can be a momentary break or dip in the current as one sense resistor is switched out for another sense resistor. This momentary break or dip in the current can cause some loads to reset or otherwise fail to operate as intended. As a result, there is a need for a current sense circuit that can operate over a wide range of currents without any momentary break or dip in the current.

SUMMARY OF THE INVENTION

The present invention is a current sense circuit that can operate over a wide range of currents. The current sense circuit includes a sense bipolar transistor that has a base, a collector, and an emitter. The current sense circuit also includes a sense resistor that is connected to the emitter of the sense bipolar transistor, and a front end circuit that is connected to the sense bipolar transistor and the sense resistor. The front end circuit generates an amplified and compensated base-emitter voltage in response to a base-emitter voltage of the sense bipolar transistor. The amplified and compensated base-emitter voltage varies in response to changes in an emitter current that flows out of the emitter of the sense bipolar transistor. The emitter current is substantially equal to a resistor current that flows out of the sense resistor.

The present invention also includes a method of operating a current sense circuit. The method includes generating an amplified and compensated base-emitter voltage in response to a base-emitter voltage of a sense bipolar transistor. The amplified and compensated base-emitter voltage varies in response to changes in an emitter current that flows out of the emitter of the sense bipolar transistor. The emitter current is substantially equal to a resistor current that flows out of a sense resistor. The method also includes periodically sampling the amplified and compensated base-emitter voltage to generate a series of digital values that represent the amplified and compensated base-emitter voltage. The method further includes performing a transfer function on the series of digital values to generate a series of current values so that each digital value has a corresponding current value. The series of current values identify a magnitude of the emitter current.

A better understanding of the features and advantages of the present invention will be obtained by reference to the following detailed description and accompanying drawings which set forth an illustrative embodiment in which the principals of the invention are utilized.

DETAILED DESCRIPTION OF THE INVENTION

Figure 1:
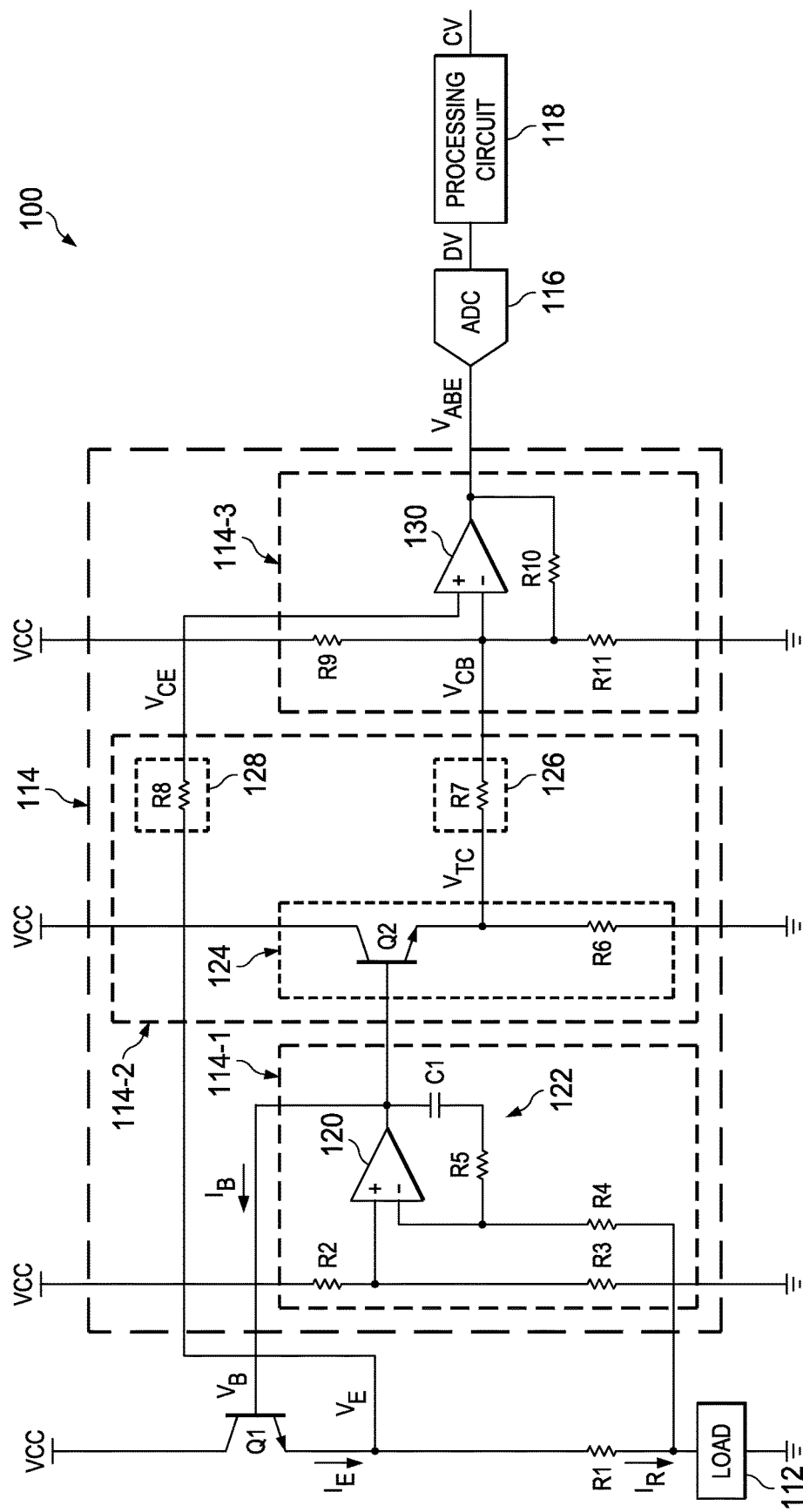
FIG. 1 is a block-schematic diagram illustrating an example of a current sense circuit 100 in accordance with the present invention.

FIG. 1 shows a block-schematic diagram that illustrates an example of a current sense circuit 100 in accordance with the present invention. As described in greater detail below, current sense circuit 100 utilizes the non-linear current characteristics of the base-emitter junction of a bipolar transistor to compress and sense the current logarithmically.

As shown in FIG. 1, current sense circuit 100 includes a sense bipolar transistor Q1 and a sense resistor R1. Sense bipolar transistor Q1 has a base, a collector that is connected to a voltage source VCC, and an emitter that is connected to sense resistor R1. Sense resistor R1 has a first end that is connected to the emitter of bipolar transistor Q1, and a second end that is connected to a load 112. In the present example, the voltage source VCC has a value of 5V, and sense resistor R1 has a value of 0.1Ω.

When current sense circuit 100 is in operation, a base voltage $V_B$ is present on the base of sense bipolar transistor Q1, and an emitter voltage $V_E$ is present on the emitter of sense bipolar transistor Q1. Further, a base-emitter voltage $V_{BE}$ of bipolar transistor Q1 is the voltage difference between the base voltage $V_B$ and the emitter voltage $V_E$ of bipolar transistor Q1. In addition, the base-emitter voltage $V_{BE}$ of transistor Q1 varies in response to changes in an emitter current $I_E$ that flows out of the emitter of bipolar transistor Q1.

As further shown in FIG. 1, current sense circuit 100 also includes a front end circuit 114 that is connected to sense bipolar transistor Q1 and sense resistor R1. Front end circuit 114 generates an amplified and compensated base-emitter voltage $V_{ABE}$ in response to the base-emitter voltage of sense bipolar transistor Q1.

Since the base-emitter voltage $V_{BE}$ of transistor Q1 varies in response to changes in the emitter current $I_E$, the amplified and compensated base-emitter voltage $V_{ABE}$ also varies in response to changes in the emitter current $I_E$. The emitter current $I_E$, in turn, is substantially equal to a resistor current $I_R$ that flows out of the second end of sense resistor R1.

As additionally shown in FIG. 1, current sense circuit 100 includes an analog-to-digital (A/D) converter 116 and a processing circuit 118. A/D converter 116, which is connected to front end circuit 114, receives the amplified and compensated base-emitter voltage $V_{ABE}$, and periodically samples the amplified and compensated base-emitter voltage $V_{ABE}$ to generate a series of digital values DV that represent the amplified and compensated base-emitter voltage $V_{ABE}$.

Processing circuit 118, which is connected to the output of A/D converter 116, receives the series of digital values DV and performs a transfer function of the series of digital values DV to form a series of current values so that each digital value DV forms a current value CV. The series of current values CV identify the magnitude of the emitter current $I_E$, which is substantially identical to the resistor current $I_R$ that flows out of sense resistor R1 and into load 112. The series of current values CV can be displayed in a number of well-known ways to provide a visual representation of the current magnitude. Processing circuit 118 can be implemented with any conventional microprocessor.

In the present example, the amplified and compensated base-emitter voltage $V_{ABE}$ is a logarithmic measurement of the emitter current $I_E$, and the transfer function is an inverse log function, which is performed with the equation $CV=10^{[J(K-DV)]}$, where K is a constant equal to 1.160, and J is a constant equal to 5. The current value CV is determined per decade (per 10 units). In the present example, the constant J is equal to 5 because the amplified and compensated base-emitter voltage $V_{ABE}$ is amplified by 3.3V. Current rises by 62 mV per decade in silicon and, for 3.3V, rises 0.2V per decade (62 mV*3.3V=0.2V per decade). In microprocessor applications it is easier to perform multiplication than division, so the inverse of 0.2, which is 5, is utilized.

With further respect to front end circuit 114 shown in FIG. 1, front end circuit 114 includes a drive stage 114-1 that is connected to sense bipolar transistor Q1 and sense resistor R1, a compensation stage 114-2 that is connected to sense bipolar transistor Q1 and drive stage 114-1, and an amplification stage 114-3 that is connected to compensation stage 114-2.

Drive stage 114-1 senses the magnitude of the resistor current $I_R$ that flows out of the second end of sense resistor R1, and adjusts the magnitudes of the base current $I_E$ and base voltage $V_B$ input to sense bipolar transistor Q1 so that the magnitude of the emitter current $I_E$ that flows out of the emitter of bipolar transistor Q1 follows any changes in the magnitude of the resistor current $I_R$.

In the present example, drive stage 114-1 includes an operational amplifier 120, a bias resistor R2, a bias resistor R3, and a feedback resistor R4. Operational amplifier 120 has a non-inverting input that is connected to the bias resistors R2 and R3, and an inverting input that is connected to feedback resistor R4. Bias resistor R2 is connected to the voltage source VCC and bias resistor R3, while bias resistor R3 is connected to bias resistor R2 and ground. Feedback resistor R4, in turn, is connected to the second end of sense resistor R1 and the inverting input of operational amplifier 120.

Further in the present example, bias resistor R2 has a value of 6.8 KΩ, while bias resistor R3 has a value of 15KΩ. The bias resistors R2 and R3 form a voltage divider that, when the voltage source VCC is equal to 5V, places a bias voltage of approximately 3.3V on the non-inverting input of operational amplifier 120. Alternately, the non-inverting input of operational amplifier 120 can be directly connected to a 3.3V voltage source if one is available. The voltage divider sets the output voltage fed to load 112. In addition, feedback resistor R4 has a value of 33 KΩ.

In operation, as the resistor current $I_R$ flowing out of sense resistor R1 varies, the voltage on the inverting input of operational amplifier 120 varies due to feedback resistor R4. As the voltage on the inverting input of operational amplifier 120 varies, the base current $I_B$ and the base voltage $V_B$ output from operational amplifier 120, which drives the base of sense bipolar transistor Q1, vary so that the magnitude of the emitter current $I_E$ follows any changes in the magnitude of the resistor current $I_R$.

Drive stage 114-1 preferably also includes an AC damping circuit 122 that assures the stability of drive stage 114-1. AC damping circuit 122 includes a capacitor C1 that is connected to the output of operational amplifier 120 and a damping resistor R5 that is connected to capacitor C1 and the inverting input of operational amplifier 120. In the present example, capacitor C1 has a value of approximately 300-350 pF, while damping resistor R5 has a value of 33KΩ.

Compensation stage 114-2 adjusts the base voltage $V_B$ output by operational amplifier 120 to compensate for a number of conditions, and outputs a compensated base voltage $V_{CB}$ in response. In the present example, compensation stage 114-2 includes a temperature compensation circuit 124 that adjusts the base voltage $V_B$ output by operational amplifier 120 to compensate for the effects of temperature change, and outputs a temperature-compensated base voltage $V_{TC}$ in response.

Temperature compensation circuit 124 includes a compensation bipolar transistor Q2 and a resistor R6. Compensation bipolar transistor Q2 has a collector connected to the voltage source VCC, a base connected to the output of operational amplifier 120, and an emitter connected to resistor R6. Resistor R6 has a first end connected to the emitter of bipolar transistor Q2, and a second end connected to ground. In the present example, resistor R6 has a value of 3.3KΩ.

The bipolar transistors Q1 and Q2, which are substantially matched, are placed close together so that any temperature changes experienced by bipolar transistor Q1 are also experienced by bipolar transistor Q2. For example, large magnitude currents passing through bipolar transistor Q1 can generate significant amounts of heat that can affect the characteristics of transistor Q1. When placed in close proximity, bipolar transistor Q2 experiences substantially the same heat effects as bipolar transistor Q1.

The voltage on the emitter of bipolar transistor Q2 is one $V_{BE}$ (approximately 0.65V) less than the base voltage $V_B$ output by operational amplifier 120, with the $V_{BE}$ value of bipolar transistor Q2 varying in the same amount that the $V_{BE}$ value of bipolar transistor Q1 varies in response to changes in temperature.

In the present example, compensation stage 114-2 also includes a scaling circuit 126 that scales the temperature-compensated base voltage $V_{TA}$ to prevent amplification stage 114-3 from saturating, and outputs the compensated base voltage $V_{CB}$ in response. Scaling circuit 126 includes resistor R7 with a value of 10 KΩ that is connected to the emitter of compensation bipolar transistor Q2.

Compensation stage 114-2 also adjusts the emitter voltage $V_E$ on sense bipolar transistor Q1 to compensate for a number of conditions, and outputs a compensated emitter voltage $V_{CE}$ in response. In the present example, compensation stage 114-2 includes an ohmic compensation circuit 128 that adjusts the emitter voltage $V_E$ on sense bipolar transistor Q1 to compensate for the effects of ohmic resistance, and outputs a compensated emitter voltage $V_{CE}$ in response. Ohmic compensation circuit 128 includes a resistor R8 with a value of 15KΩ that is connected to the emitter of sense bipolar transistor Q1.

Ohmic resistance results from current that flows through the bond wiring, metal interconnects, and bulk semiconductor resistance within bipolar transistor Q1. In the present example, current sense circuit 100 operates on currents that range from less than 1 µA to 100 mA, and the effects of ohmic resistance are noticeable for currents in excess of approximately 1 mA. Resistor R8 substantially eliminates the effects of the ohmic resistance.

Amplification stage 114-3 amplifies the difference between the compensated base voltage $V_{CB}$ and the compensated emitter voltage $V_{CE}$, and generates the amplified and compensated base-emitter voltage $V_{ABE}$ in response. The relationship between the emitter current $I_E$ that flows out of the emitter of sense bipolar transistor Q1 and the base-emitter voltage $V_{BE}$ of sense bipolar transistor Q1 is logarithmic, i.e., $\log_e(I_E)=V_{BE}$. As a result, the base-emitter voltage $V_{BE}$ of bipolar transistor Q1 is a logarithmic measurement of the current $I_E$ that flows out of the emitter of sense bipolar transistor Q1 which, in turn, is substantially identical to the resistor current $I_R$ that flows out of sense resistor R1.

Since the compensated base voltage $V_{CB}$ is a compensated version of the base voltage $V_B$ and the compensated emitter voltage $V_{CE}$ is a compensated version of the emitter voltage $V_E$, the amplified and compensated base-emitter voltage $V_{ABE}$ is also a logarithmic measurement of the current $I_E$ that flows out of the emitter of sense bipolar transistor Q1 which, in turn, is substantially identical to the resistor current $I_R$ that flows out of sense resistor R1.

In the present example, amplification stage 114-3 includes an operational amplifier 130, a resistor R9, a resistor R10, and a resistor R11. Operational amplifier 130 has a non-inverting input that is connected to the second end of resistor R8 of ohmic compensation circuit 128, and an inverting input that is connected to resistor R9, resistor R10, and resistor R11. Resistor R9 is connected to the voltage source VCC and resistor R10, while resistor R10 is connected to resistor R9 and the output of operational amplifier 130. Resistor R11 is connected to the inverting input of operational amplifier 130 and ground.

Further in the present example, resistor R9 has a value of 10 KΩ, while resistor R10 has a value of 33KΩ and resistor R11 has a value of 33 KΩ. The resistors R9 and R10 form a voltage divider that sets the gain of operational amplifier 130, while the resistors R9 and R11 set a bias voltage on the inverting input of operational amplifier 130.

In operation, operational amplifier 130 amplifies the difference between the compensated base voltage $V_{CB}$, which is a temperature-compensated scaled version of the base voltage $V_B$, and the compensated emitter voltage $V_{CE}$, which is an ohmic-compensated version of the emitter voltage $V_E$, to generate the amplified and compensated base-emitter voltage $V_{ABE}$.

When input to the inverting input of operational amplifier 130, the temperature compensated base voltage $V_{TC}$ portion of the compensated base voltage $V_{CB}$ subtracts out the temperature coefficient which, in turn, compensates for any variation in the operating characteristics of sense bipolar transistor Q1 that result from changes in temperature.

One of the advantages of the present invention is that a wide range of currents, such as from less than 1 µA to 100 mA, can be continuously sensed without the need to use resistor switching circuitry. Thus, the present invention can sense a wide range of currents without any momentary break or dip in the current. In the present example, the most important characteristic, in order to get a multi-decade sensing capability, is that the base-emitter voltage is the log function of the load current, thus compressing the wide current range into a much more manageable voltage range.

Figure 2:
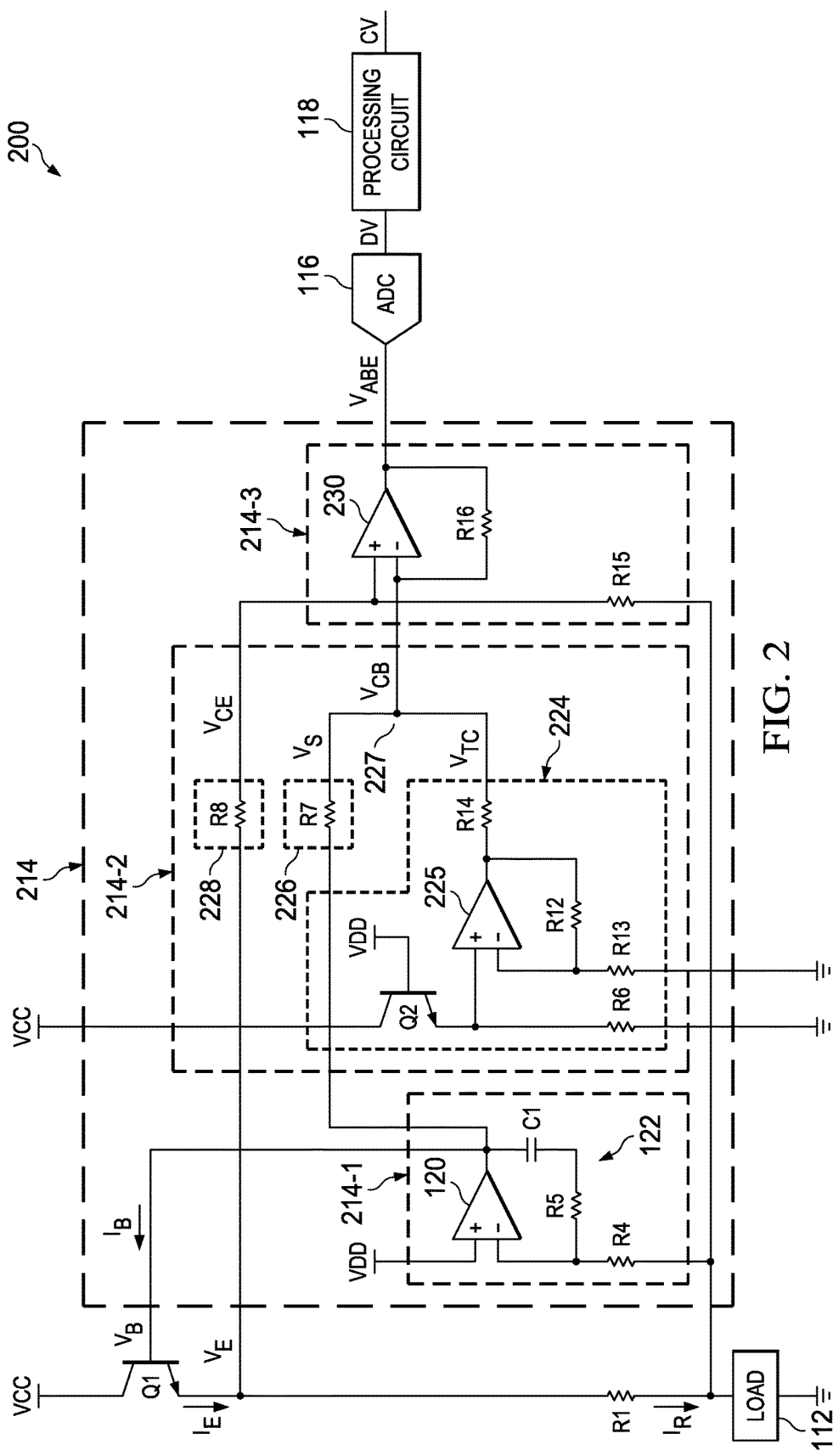
FIG. 2 is a block-schematic diagram illustrating an example of a current sense circuit 200 in accordance with an alternate embodiment of the present invention.

FIG. 2 shows a block-schematic diagram that illustrates an example of a current sense circuit 200 in accordance with an alternate embodiment of the present invention. Current sense circuit 200 is similar to current sense transistor 100 and, as a result, utilizes the same reference numerals to designate the structures that are common to both circuits.

As shown in FIG. 2, current sense circuit 200 differs from current sense circuit 100 in that current sense circuit 200 utilizes a front end circuit 214 in lieu of front end circuit 114. Front end circuit 214 operates the same as front end circuit 114, i.e., front end circuit 214 generates an amplified base-emitter voltage $V_{ABE}$ in response to the base-emitter voltage of sense bipolar transistor Q1. In addition, the amplified and compensated base-emitter voltage $V_{ABE}$ also varies in response to changes in the emitter current $I_E$.

Front end circuit 214 includes a drive stage 214-1 that is connected to sense bipolar transistor Q1 and sense resistor R1, a compensation stage 114-2 that is connected to sense bipolar transistor Q1 and drive stage 214-1, and an amplification stage 214-3 that is connected to compensation stage 214-2.

Drive stage 214-1 operates the same as drive stage 114-1, i.e., drive stage 214-1 senses the magnitude of the resistor current $I_R$ that flows out of the second end of sense resistor R1, and adjusts the magnitudes of the base current $I_B$ and base voltage $V_B$ input to sense bipolar transistor Q1 so that the magnitude of the emitter current $I_E$ that flows out of the emitter of bipolar transistor Q1 follows any changes in the magnitude of the resistor current $I_R$.

In the present example, drive stage 214-1 differs from drive stage 114-1 in that drive stage 214-1 utilizes a power supply VDD in lieu of the resistors R2 and R3 of drive stage 114-1, and connects the non-inverting input of operational amplifier 120 to the power supply VDD. In addition, the voltage source VDD has a value of 3.3V.

Compensation stage 214-2 operates the same as compensation stage 114-1, i.e., compensation stage 214-2 adjusts the base voltage $V_B$ to compensate for a number of conditions, and outputs a compensated base voltage $V_{CB}$ in response. In addition, compensation stage 214-2 also adjusts the emitter voltage $V_E$ to compensate for a number of conditions, and outputs a compensated emitter voltage $V_{CE}$ in response.

In the present example, compensation stage 214-2 includes a temperature compensation circuit 224 that senses the effects of temperature change on sense bipolar transistor Q1, and outputs a temperature-compensated voltage $V_{TC}$ in response to compensate for the effects of the temperature change.

Temperature compensation circuit 224 includes a compensation bipolar transistor Q2 and a resistor R6. Compensation bipolar transistor Q2 has a collector connected to the voltage source VCC, a base connected to the voltage source VDD, and an emitter connected to resistor R6. Resistor R6 has a first end connected to the emitter of bipolar transistor Q2, and a second end connected to ground. In the present example, resistor R6 has a value of 3.3 KΩ.

Temperature compensation circuit 224 also includes an operational amplifier 225, a resistor R12, a resistor R13, and a resistor R14. Operational amplifier 225 has a non-inverting input that is connected to the emitter of compensation bipolar transistor Q2, and an inverting input that is connected to the resistors R12 and R13. Resistor R12 is connected to the output of operational amplifier 225 and resistor R13, while resistor R13 is connected to resistor R12 and ground. Resistor R14 has a first end and a second end with the first end connected to the output of operational amplifier 225. In the present example, resistor R12 has a value of 10 KΩ, resistor R13 has a value of 43KΩ, and resistor R14 has a value of 12KΩ. In addition, resistors R12 and R13 set the gain of operational amplifier 225, which is approximately 1.25.

The bipolar transistors Q1 and Q2, which are substantially matched, are placed close together so that any temperature changes experienced by bipolar transistor Q1 are also experienced by bipolar transistor Q2. For example, large magnitude currents passing through bipolar transistor Q1 can generate significant amounts of heat that can affect the characteristics of transistor Q1. When placed in close proximity, bipolar transistor Q2 experiences substantially the same heat effects.

The voltage on the emitter of compensation bipolar transistor Q2 is one $V_{BE}$ (approximately 0.65V) less than the power supply voltage VDD, with the $V_{BE}$ value of compensation bipolar transistor Q2 varying in the same amount that the $V_{BE}$ value of sense bipolar transistor Q1 varies in response to changes in temperature. Operational amplifier 225 amplifies the voltage on the emitter of bipolar transistor Q2 (VDD-$V_{BE}$), and output resistor R14 scales the amplified voltage to prevent amplification stage 114-3 from saturating.

In the present example, compensation stage 214-2 also includes a scaling circuit 226 that scales the base voltage $V_B$ output from operational amplifier 120 to prevent amplification stage 214-3 from saturating, and outputs a scaled voltage $V_S$ in response. Scaling circuit 226 includes resistor R7 with a value of 10 KΩ that is connected to the output of operational amplifier 120. Temperature compensation circuit 224 and scaling circuit 226 are connected together by a node 227, which sums together the temperature-compensated base voltage $V_{TC}$ and the scaled voltage $V_S$ to form the compensated base voltage $V_{CB}$.

Further in the present example, compensation stage 214-2 includes an ohmic compensation circuit 228 that adjusts the emitter voltage $V_E$ on sense bipolar transistor Q1 to compensate for the effects of ohmic resistance, and outputs a compensated emitter voltage $V_{CE}$ in response. Ohmic compensation circuit 228 includes a compensation resistor R8 with a value of 15 KΩ that is connected to the emitter of sense bipolar transistor Q1.

Ohmic resistance results from current that flows through the bond wiring, metal interconnects, and bulk semiconductor resistance within bipolar transistor Q1. In the present example, current sense circuit 200 operates on currents that range from less than 1 µA to 100 mA, and the effects of ohmic resistance are noticeable for currents in excess of approximately 1 mA. Compensation resistor R8 substantially eliminates the effects of the ohmic resistance.

Amplification stage 214-3 operates the same as amplification stage 114-3, i.e., amplification stage 214-3 amplifies the difference between the compensated base voltage $V_{CB}$ and the compensated emitter voltage $V_{CE}$, and generates the amplified base-emitter voltage $V_{ABE}$ in response. In the present example, amplification stage 214-3 includes an operational amplifier 230, a resistor R15, and a resistor R16.

Operational amplifier 230 has a non-inverting input that is connected to the second end of resistor R8 of ohmic compensation circuit 228 and to resistor R15, and an inverting input that is connected to resistor R7, resistor R14, and resistor R16. Resistor R15 is connected to resistor R8 and the second end of sense resistor R1. Resistor R16 is connected to the inverting input of operational amplifier 230 and the inverting input of operational amplifier 230. Further in the present example, resistor R15 has a value of 33KΩ, while resistor R16 has a value of 33KΩ.

In operation, operational amplifier 230 amplifies the difference between the compensated base voltage $V_{CB}$, which is a temperature-compensated scaled version of the base voltage $V_B$ output by operational amplifier 120, and the compensated emitter voltage $V_{CE}$, which is an ohmic-compensated version of the emitter voltage $V_E$ on bipolar transistor Q1, to generate the amplified and compensated base-emitter voltage $V_{ABE}$. The resistors R7 and R16 form a voltage divider that sets the gain of operational amplifier 230. Resistor R15 scales the compensated emitter voltage $V_{CE}$ to prevent operational amplifier 230, which has an input range of 0V to 3.3V in the present example, from saturating.

When input to the inverting input of operational amplifier 230, the temperature compensated voltage $V_{TC}$ portion of the compensated base voltage $V_{CB}$ subtracts out the temperature coefficient which, in turn, compensates for any variation in the operating characteristics of sense bipolar transistor Q1 that result from changes in temperature.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A current sense circuit comprising:
    a sense bipolar transistor having a base, a collector, and an emitter;
    a sense resistor that is connected to the emitter of the sense bipolar transistor; and
    a front end circuit that is connected to the sense bipolar transistor and the sense resistor, the front end circuit to generate an amplified and compensated base-emitter voltage in response to a base-emitter voltage of the sense bipolar transistor, the amplified and compensated base-emitter voltage to vary in response to changes in an emitter current that flows out of the emitter of the sense bipolar transistor, the emitter current being substantially equal to a resistor current that flows out of the sense resistor;
    wherein the front end circuit includes a drive stage that is connected to the sense bipolar transistor and the sense resistor, the drive stage to sense a magnitude of the resistor current that flows out of the sense resistor, and adjust a magnitude of a base current and a base voltage input to the sense bipolar transistor so that a magnitude of the emitter current follows any changes in the magnitude of the resistor current;
    further comprising an analog-to-digital (A/D) converter that is connected to the front end circuit, the A/D converter to receive the amplified and compensated base-emitter voltage, and periodically sample the amplified and compensated base-emitter voltage to generate a series of digital values that represent the amplified and compensated base-emitter voltage.

2. The current sense circuit of claim 1 and further comprising a processing circuit that is connected to the A/D converter, the processing circuit to receive the series of digital values and perform a transfer function on the series of digital values to form a series of current values so that each digital value has a current value, the series of current values to identify the magnitude of the emitter current.

3. The current sense circuit of claim 2 wherein the transfer function is an inverse log function.

4. A current sense circuit comprising:
   a sense bipolar transistor having a base, a collector, and an emitter;
   a sense resistor that is connected to the emitter of the sense bipolar transistor; and
   a front end circuit that is connected to the sense bipolar transistor and the sense resistor, the front end circuit to generate an amplified and compensated base-emitter voltage in response to a base-emitter voltage of the sense bipolar transistor, the amplified and compensated base-emitter voltage to vary in response to changes in an emitter current that flows out of the emitter of the sense bipolar transistor, the emitter current being substantially equal to a resistor current that flows out of the sense resistor;
   wherein the front end circuit includes a drive stage that is connected to the sense bipolar transistor and the sense resistor, the drive stage to sense a magnitude of the resistor current that flows out of the sense resistor, and adjust a magnitude of a base current and a base voltage input to the sense bipolar transistor so that a magnitude of the emitter current follows any changes in the magnitude of the resistor current;
   wherein the drive stage includes:
   a first operational amplifier having a non-inverting input, an inverting input, and an output, the output of the first operational amplifier being connected to the base of the sense bipolar transistor, the first operational amplifier outputting the base voltage; and
   a feedback resistor connected to the sense resistor and the inverting input of the first operational amplifier.

5. The current sense circuit of claim 4 wherein the drive stage further includes an AC damping circuit, the AC damping circuit having a capacitor connected to the output of the first operational amplifier, and a damping resistor connected to the capacitor and the inverting input of the first operational amplifier.

6. The current sense circuit of claim 4 and further comprising an analog-to-digital (A/D) converter that is connected to the front end circuit, the A/D converter to receive the amplified and compensated base-emitter voltage, and periodically sample the amplified and compensated base-emitter voltage to generate a series of digital values that represent the amplified and compensated base-emitter voltage.

7. The current sense circuit of claim 6 and further comprising a processing circuit that is connected to the A/D converter, the processing circuit to receive the series of digital values and perform a transfer function on the series of digital values to form a series of current values so that each digital value has a current value, the series of current values to identify the magnitude of the emitter current.

8. The current sense circuit of claim 7 wherein the front end circuit further includes:
   a compensation stage that is connected to the sense bipolar transistor and the drive stage, the compensation stage adjusts the base voltage output by the first operational amplifier to compensate for a first number of conditions, and outputs a compensated base voltage in response, and adjusts an emitter voltage on the sense bipolar transistor to compensate for a second number of conditions; and
   an amplification stage that is connected to compensation stage, the amplification stage amplifies a difference between the compensated base voltage and the compensated emitter voltage, and generates the amplified and compensated base-emitter voltage in response.

9. The current sense circuit of claim 8 wherein the compensation stage includes:
   a temperature compensation circuit that adjusts the base voltage output by the first operational amplifier to compensate for changes in temperature, and outputs a temperature-compensated base voltage in response;
   a scaling circuit that adjusts the temperature-compensated base voltage to scale the temperature-compensated base voltage, and outputs the compensated base voltage in response; and
   an ohmic compensation circuit that adjusts the emitter voltage on the sense bipolar transistor to compensate for ohmic resistance, and outputs a compensated emitter voltage in response.

10. The current sense circuit of claim 9 wherein the amplification stage includes:
    a second operational amplifier having a non-inverting input connected to the ohmic compensation circuit, an inverting input connected to the scaling circuit, and an output;
    a first resistor connected to a power supply and the inverting input of the second operational amplifier;
    a second resistor connected to the inverting input of the second operational amplifier and ground; and
    a third resistor connected to the inverting input of the second operational amplifier and the output of the second operational amplifier.

11. The current sense circuit of claim 8 wherein the compensation stage includes a temperature compensation circuit that senses a temperature change on the sense bipolar transistor, and outputs a temperature-compensated base voltage in response to compensate for the temperature change.

12. The current sense circuit of claim 11 wherein the compensation stage further includes a scaling circuit that adjusts the base voltage output by the first operational amplifier to scale the base voltage output by the first operational amplifier, and outputs a scaled voltage in response.

13. The current sense circuit of claim 12 wherein the compensation stage additionally includes a node that sums together the temperature-compensated base voltage and the scaled voltage to form the compensated base voltage.

14. The current sense circuit of claim 13 wherein the compensation stage also includes an ohmic compensation circuit that adjusts the emitter voltage on the sense bipolar transistor to compensate for ohmic resistance, and outputs the compensated emitter voltage in response.

15. A method of operating a current sense circuit comprising:
    generating an amplified and compensated base-emitter voltage in response to a base-emitter voltage of a sense bipolar transistor, the amplified and compensated base-emitter voltage to vary in response to changes in an emitter current that flows out of an emitter of the sense bipolar transistor, the emitter current being substantially equal to a resistor current that flows out of a sense resistor;
    periodically sampling the amplified and compensated base-emitter voltage to generate a series of digital values that represent the amplified and compensated base-emitter voltage; and performing a transfer function on the series of digital values to generate a series of current values so that each digital value has a corresponding current value, the series of current values to identify a magnitude of the emitter current.

16. The method of claim 15 wherein the sense bipolar transistor has an emitter connected to the sense resistor.

17. The method of claim 16 wherein generating the amplified and compensated base-emitter voltage includes sensing a magnitude of the resistor current that flows out of the sense resistor, and adjusting a magnitude of a base current and a magnitude of a base voltage input to the sense bipolar transistor so that the magnitude of the emitter current follows any changes in the magnitude of the resistor current.

18. The method of claim 16 wherein the transfer function is an inverse log function.

* * * * *